United States Patent [19]

Ota

[11] Patent Number: 4,523,811
[45] Date of Patent: Jun. 18, 1985

[54] LIQUID CRYSTAL DISPLAY MATRIX INCLUDING A NON-LINEAR DEVICE

[75] Inventor: Tadashi Ota, Suwa, Japan

[73] Assignee: Kabushiki Kaisha Suwa Seikosha, Tokyo, Japan

[21] Appl. No.: 339,526

[22] Filed: Jan. 15, 1982

[30] Foreign Application Priority Data

Jan. 16, 1981 [JP] Japan ................................. 56-4850
Aug. 25, 1981 [JP] Japan ............................. 56-132904
Sep. 4, 1981 [JP] Japan ............................. 56-139549

[51] Int. Cl.³ .......................... G02F 1/13; H01C 7/10; H01C 7/13
[52] U.S. Cl. ................................... 350/333; 350/336; 350/339 R; 338/20
[58] Field of Search ........... 350/333, 334, 336, 339 R; 338/20

[56] References Cited

U.S. PATENT DOCUMENTS 3,271,591 9/1966 Ovshinsky ..................... 338/20 X
3,727,165 4/1973 Hagen ................................ 338/20
4,413,883 11/1983 Baraff et al. ................ 350/333 X

FOREIGN PATENT DOCUMENTS 2050031A 12/1980 United Kingdom ............... 350/333

OTHER PUBLICATIONS

Baraff, D. R. et al., "A 68 Line Multiplexed Liquid Crystal Display Using MIM Devices," IEEE Conference: Int'l Electronic Devices Meeting (Dec. 8–10, 1980) pp. 707–710.

Primary Examiner—John K. Corbin
Assistant Examiner—Richard F. Gallivan
Attorney, Agent, or Firm—Blum Kaplan Friedman Silberman & Beran

[57] ABSTRACT

An active matrix liquid crystal display device wherein individual display elements are controlled by non-linear devices and methods of fabricating the display devices are provided. The non-linear devices are metal-insulator-metal structures (MIM). Two MIM elements are coupled in parallel to each other and connected to each display element in series. The MIM element includes a metallic thin film of Ta or nitrogen doped Ta and an oxide film formed by anodizing the metallic thin film and a second metallic thin film. The liquid crystal display matrix is formed by depositing a lower metallic thin film on a transparent substrate, selectively removing the first film, anodizing the surface of the first metallic thin film, depositing a pattern of an upper metallic thin film and selectively removing both the lower metallic thin film and the anodized oxide film at the regions other than where the MIM elements are being formed. The upper metallic thin film is selectively patterned to form an electrode of a display element. The two substrates are then bonded together spaced apart and a liquid crystal material is encapsulated therebetween and polarizers are disposed on the outer surfaces of the substrates for forming the matrix display.

9 Claims, 49 Drawing Figures

FIG. 1
PRIOR ART
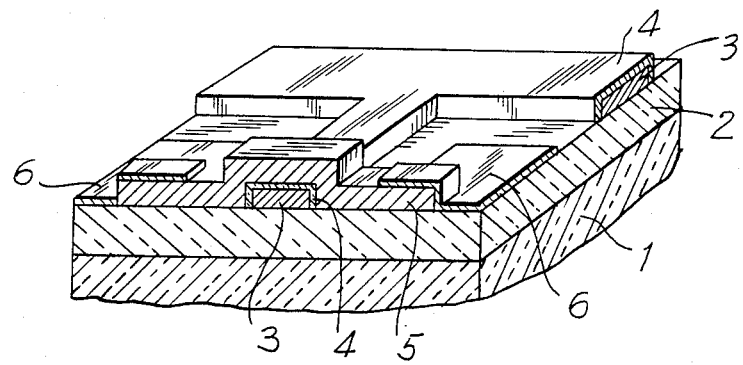
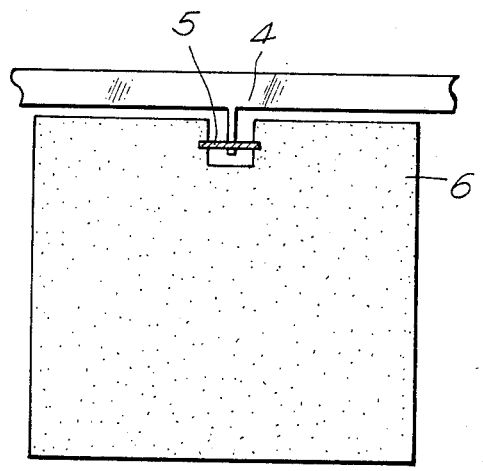
FIG. 2
PRIOR ART

FIG.6
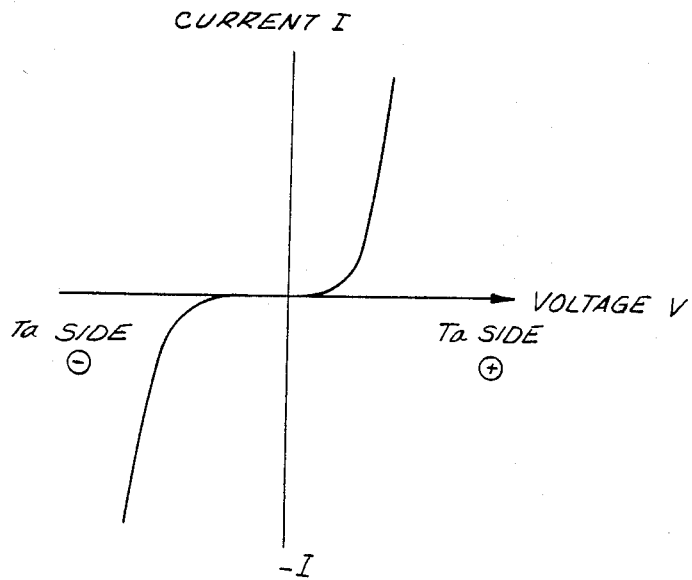
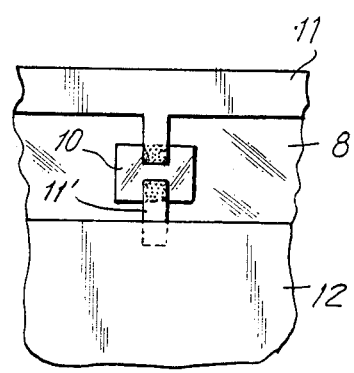
FIG.7(a)
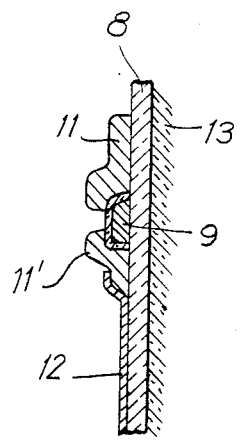
FIG.7(b)

FIG.8(a)
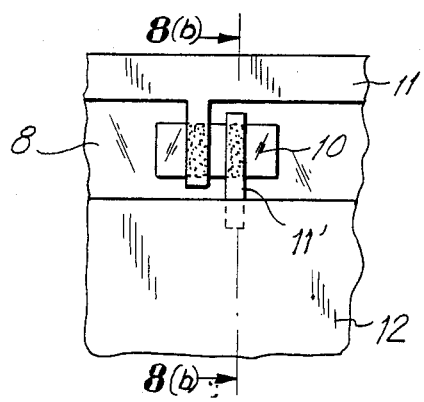
FIG.8(b)
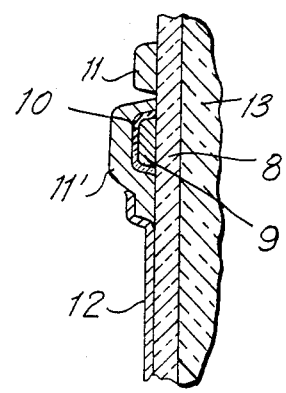
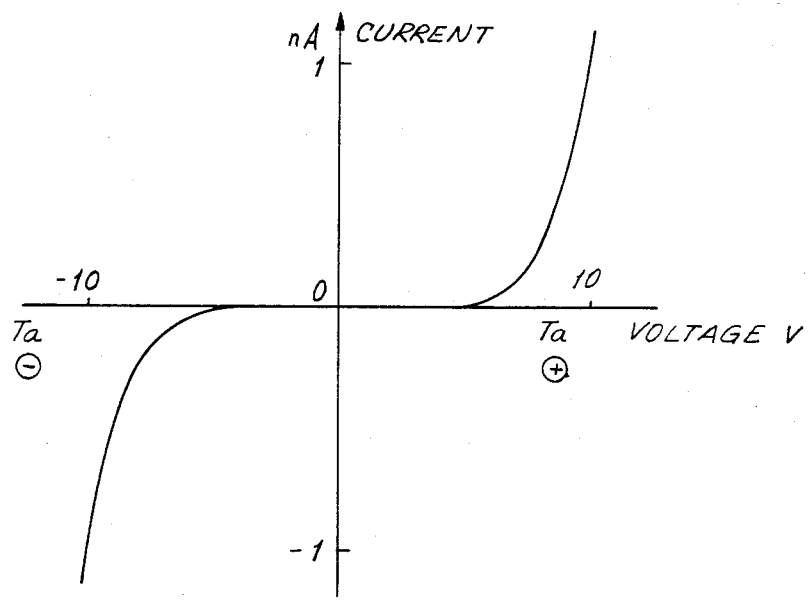
FIG.9

FIG.14(a)
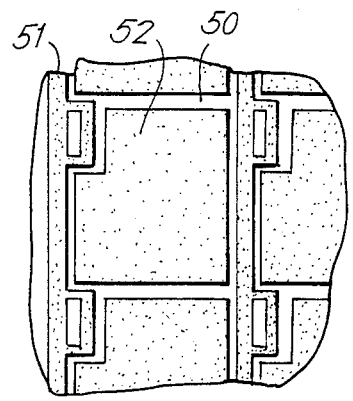
FIG.14(b)
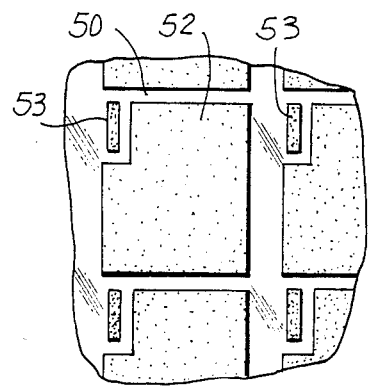
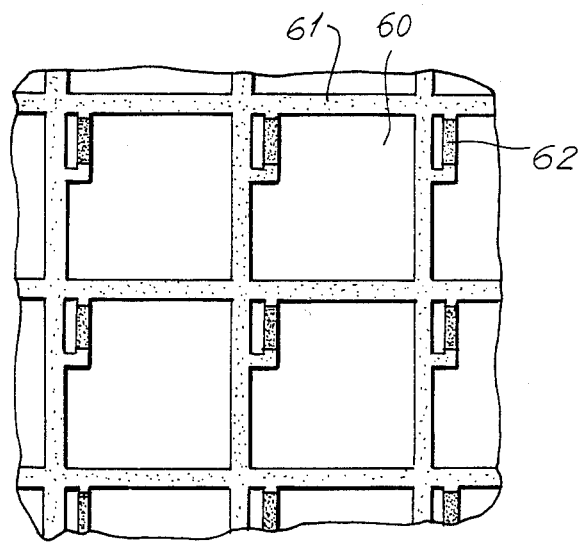
FIG.15

FIG. 16
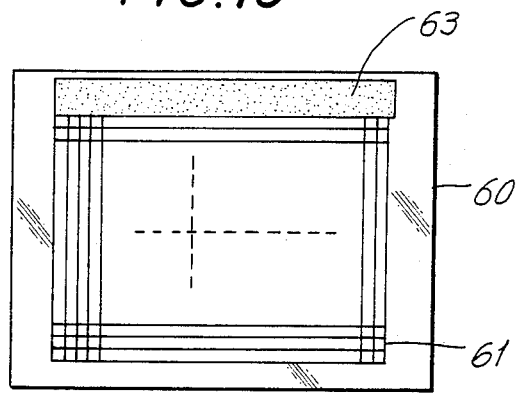
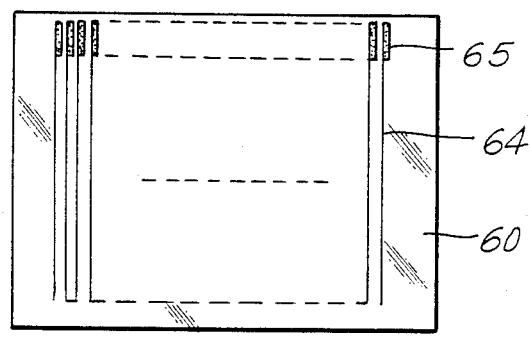
FIG. 17
PRIOR ART

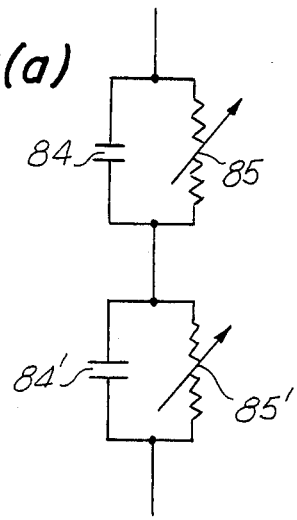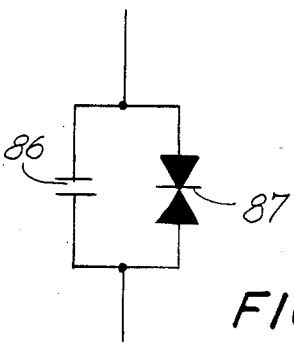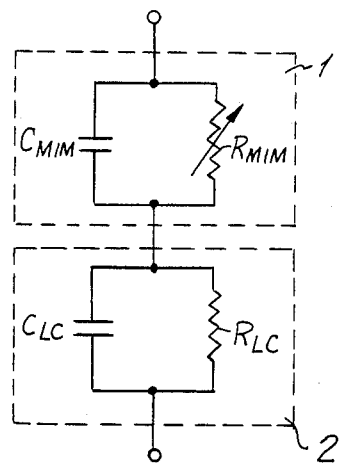
FIG.20(a)
FIG.20(b)
FIG.21

FIG.23(a) 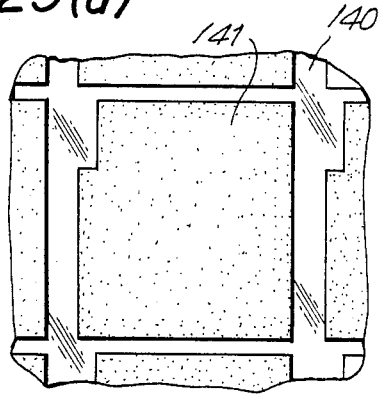 FIG.23(b) 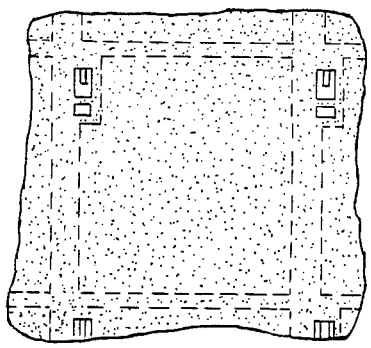
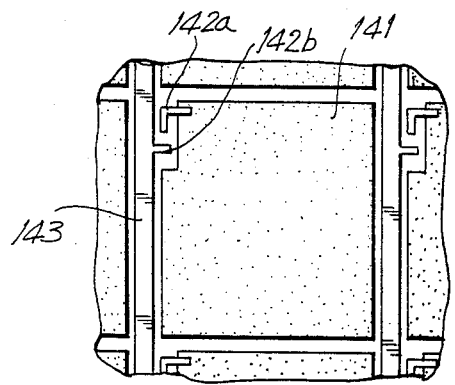 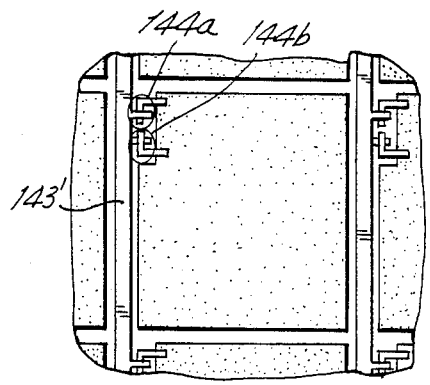
FIG.23(c) FIG.23(d)
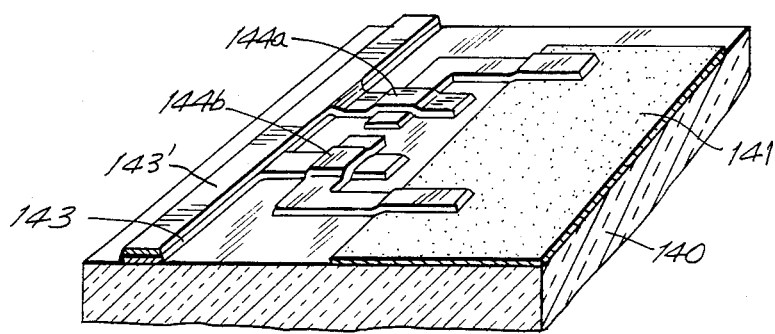
FIG.24

FIG.25(a)
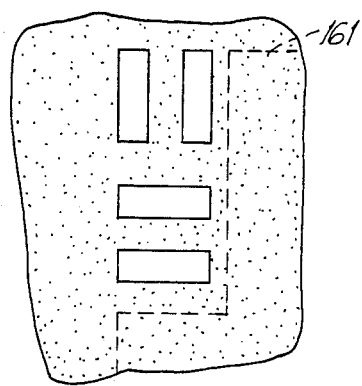
FIG.25(b)
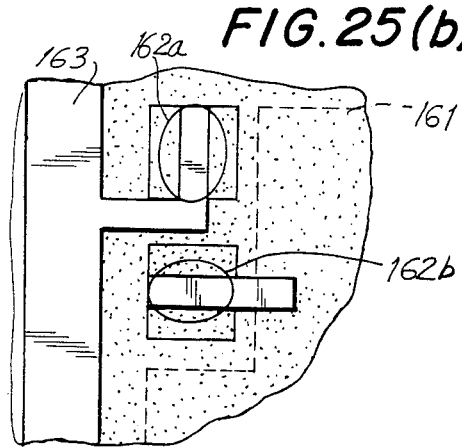
FIG.25(c)
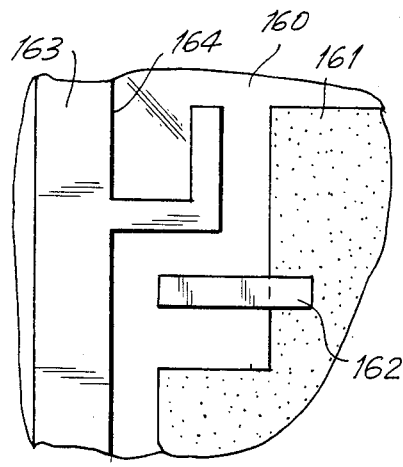
FIG.25(d)
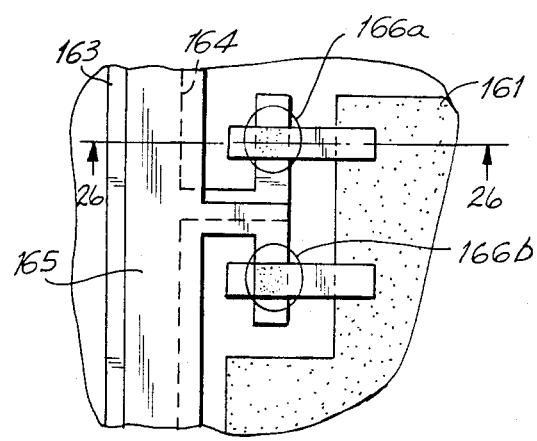
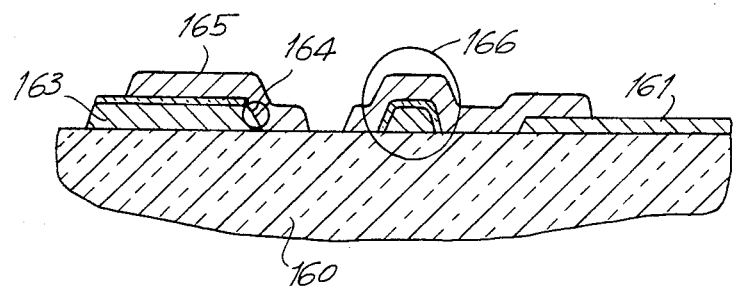
FIG.26

LIQUID CRYSTAL DISPLAY MATRIX INCLUDING A NON-LINEAR DEVICE

BACKGROUND OF THE INVENTION

This invention relates to liquid crystal display devices, and particularly to active matrix liquid crystal display devices wherein a non-linear device is combined with display elements in order to improve the display characteristics.

In recent years, the field of application of twisted nematic liquid crystal display devices (hereinafter referred to as TN liquid crystal display devices) has expanded. The TN liquid crystal display devices have been utilized in great quanities in electronic equipment and small-size equipment, such as for example, wristwatches, electronic calculators, and the like. In order to increase the field of application for such display devices, it is necessary to increase the display capacitiy of the display devices. However, the liquid crystal display devices in accordance with the prior art are not fully satisfactory for this objective. The structure of conventional TN liquid crystal display devices includes a nematic liquid crystal material encapsulated between substrates so the the macroaxis of the liquid crystal molecule may be twisted at an angle of about 90°. Transparent electrodes are deposited on the interior surfaces of substrates which are sandwiched between a polarizer and analyzer wherein the axis of polarization are crossed at an angle of about 90°. The display is produced by the field effect of the liquid crystal material.

In order to improve the display in such devices, conventional TN liquid crystal display devices are driven in a multiplex mode. However, this multiplex driving is generally limited to only some ten lines as there is little difference between the effective voltages applied to a selected element, a non-selected element and a half-selected element. The cross talk tends to increase when the number of lines is increased. This shortcoming is caused by the non-sharpness of the voltage-contrast characteristics.

In order to increase the display capacitiy of the liquid crystal display device, an active multiplex device using a switching device or a non-linear device has been proposed. Various approaches to the non-linear devices, such as TFT or a diode consisting of amorphous silicon or polysilicon or a varistor consisting of zinc oxide have been proposed. Among the above-mentioned non-linear devices, the non-linear device utilizing a structure of metal-insulator-metal (MIM) is the most promising. The MIM is advantageous in that its manufacturing process is relatively simple as is the design of the device because of its simple structure. The above-mentioned MIM exhibits a non-linear voltage-current characteristic as shown in FIG. 1. In this case, the electric current is based on a tunnel effect, the Schottky effect or the Poole-Frenkel effect. The device utilizes an oxide layer of tantalum or tantalum nitride and has been proposed by Baraff, D. R., et al., (1980, SID International Symposium Digest of Technical Papers, Vol. XI, p. 200, April, 1980). The oxides of Al, Ta, Nb, Ti, Si, and the like or the oxides of the above-mentioned metals doped with nitrogen, an inorganic material, such as a chalcogenide glass and the like, or an organic film can be utilized as an insulator.

When the above-mentioned metallic oxides are utilized as an insulator in the MIM, the thickness of the oxide layer results in different conduction structures. It is known that the tunnel effect predominates when the insulator film is in the range of about 50–100 Å, that the Schottky effect and the Poole-Frenkel effect predominate when the insulator film is in the range of between about 100–1,000 Å. With respect to the connection between a liquid crystal display element and a MIM, which is an object of this invention, it is desirable to utilize an insulating film in the region for exhibiting the Poole-Frenkel effect in view of the liquid crystal driving method. In this region, the above-mentioned voltage-current characteristics is represented by the Poole-Frenkel expression as follows:

$$I = KV \exp(\beta \sqrt{V}) \qquad (I)$$

Where I is the electric current, V is the applied voltage, K and $\beta$ are constants which indicate the easiness of flow of the electric current and non-linearity, respectively.

When the liquid crystal display device including a MIM is driven by the generalized AC amplitude selective multiplexing method, which is utilized in the normal matrix driving a liquid crystal display element, the ratio of ON/OFF effective voltage which is actually applied to the liquid crystal material becomes larger than the ratio of ON/OFF effective voltage of the generalized AC amplitude selecting multiplexing method itself, because of the non-linearity of MIM. Therefore, matrix driving of many lines is possible. When a MIM is connected to the liquid crystal display element, as shown in FIG. 2, in an equivalent circuit for one picture element MIM and a liquid crystal display element are connected in series. In the MIM device, the capacitance $C_{MIM}$ and the non-linear resistance $R_{MIM}$ are in parallel, and a liquid crystal element the capacitance $C_{Lc}$ and the resistance $R_{Lc}$ are in parallel.

However, in the above-described MIM, a difference occurs in the voltage-current characteristics in response to the polarity of the onset voltage, and it is very difficult to remove this difference completely. In the case that a MIM having the above-mentioned rectification is connected to a liquid crystal display element, for example, when a MIM having the voltage-current characteristics as shown in FIG. 3 is coupled to a liquid crystal display element and is driven by the generalized AC amplitude selective multiplexing method in 1/5 bias, the waveform of the voltage actually applied to the liquid crystal has a polarity difference because of the rectification of the voltage-current characteristics of the MIM (A and B portions shown in FIG. 5). In this case the same waveform when applied to the liquid crystal material is not an asymmetrical alternating waveform, but an alternating waveform biased by direct current (DC). When the liquid crystal material is driven by direct current, the electrochemical reaction within the liquid crystal material itself and of the impurities therein increase. Such occurrences are undesirable as they adversely effect duration of the usefulness of the liquid crystal display device.

The equivalent circuit of a MIM element and a liquid crystal picture element in a twisted nematic liquid crystal panel show the MIM as a non-linear resistor $R_{MIM}$ in parallel with capacitor $C_{MIM}$ and the liquid crystal picture element as a resistor $R_{Lc}$ in parallel with a capacitor $C_{Lc}$. When the driving voltage is applied to both ends of the MIM and the liquid crystal picture element, the effective voltage applied to the liquid crystal picture element actually depends on the combination of the capacitor $C_{MIM}$ of the MIM and the capacitor $C_{Lc}$ of the liquid crystal picture element. According to this calculation, as the value of the capacitance $C_{MIM}$ of the MIM is less than that of the capacitor $C_{Lc}$ of the liquid crystal picture element, the permitted design limit of the MIM becomes broader. The value of the ratio of the capacitance $C_{Lc}/C_{MIM}$ is between about 5 to 20. The larger this value is, the better.

According to the designs of Baraff, the liquid crystal picture element is 1.25 mm pitch and the size of the MIM is 12 $\mu$m × 12 $\mu$m. A size between 0.3 and 0.5 mm pitch for an active matrix liquid crystal panel is generally used as a practical matter in many devices. Therefore, the MIM would have a dimension from 3 to 5 $\mu$m square within the same design limitations.

In order to obtain uniform optical characteristics in all parts of the liquid crystal panel, the characteristics of each MIM should be the same on the substrate. However, the dimension of 3 to 5 $\mu$m is difficult to obtain utilizing conventional photolithography mask aligners, but may be obtained by a fine patterned process or VLSI. Accordingly, it will be necessary to utilize high precision mask aligners in order to provide each MIM with a uniform area. As it is an object of the invention to increase the overall size of the twisted nematic liquid crystal panel including the MIM elements, this high precision mask aligning results in greater manufacturing costs.

Accordingly, it is desirable to provide an active matrix liquid crystal display device including MIM elements and processes for their preparation which avoid the disadvantages noted above. Two MIM elements connected in parallel with each other to offset rectification are connected to each liquid crystal display element in series provides symmetrical voltage-current characteristics and avoids the need of highly accurate photolithographical patterning by increasing the area of the MIM element.

SUMMARY OF THE INVENTION

Generally speaking, in accordance with the invention an active matrix liquid crystal display panel wherein individual display elements are controlled by non-linear devices and methods of fabricating the display panels are provided. The non-linear devices are resistors having a metal (Ta or nitrogen doped Ta)-oxide (anodized oxide of Ta or nitrogen doped Ta)-metal (counter electrode) construction formed by providing the counter electrode after forming the anodized oxide on the surface of the Ta thin film or nitrogen doped Ta thin film. The Ta thin film or nitrogen doped Ta thin film is used as a connector and two non-linear devices are connected in series to provide a metal-oxide-metal-oxide-metal construction. The two MIM devices connected in series have reversed polarity from each other in order to eliminate application of a direct current component to the liquid crystal.

The liquid crystal display panels including the MIM elements are formed by depositing a first metallic thin film on a substrate, patterning the deposited first metallic thin film, anodizing the surface of the remaining first metallic thin film, forming a second metallic thin film, patterning the second metallic thin film and removing both the first metallic thin film and the anodized oxide film in the regions other than where the MIM elements are being formed. A picture element electrode of $In_2O_3$ may be formed at the same time as depositing the first metallic thin film or may be patterned after the MIM is formed. In a preferred embodiment of the invention two MIM's are connected in parallel with each other in order to offset rectification and the two MIM's are connected to a single picture element in series.

Accordingly, it is an object of the invention to provide an improved liquid crystal display device.

It is another object of the invention to provide an improved liquid crystal display device including a non-linear resistor of the metal-oxide-metal (MIM) construction.

A further object of the invention is to provide an active matrix liquid crystal display utilizing a switching device of the non-linear type wherein two MIM elements having reverse polarity from each other are utilized in order to eliminate application of a direct current component to the liquid crystal.

Still another object of the invention is to provide improved methods of fabricating such improved active matrix liquid crystal display devices including two MIM's with reverse polarity in series.

Still a further object of the invention is to provide an improved active matrix liquid crystal display device including two MIM elements connected in parallel with each other in order to offset rectification and coupling two MIM elements to each picture element in the matrix in series.

Yet another object of the invention is to provide an improved method of manufacturing the liquid crystal display panel with two MIM elements connected in parallel with each other.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a partial perspective view of a MIM element of Baraff, D. R.;

FIG. 2 is a plan view of the MIM element and display electrode of Baraff;

FIG. 6 illustrates the polarity effects on the voltage-current characteristics of a MIM device;

FIG. 7(a) is a partial plan view of a MIM device prepared in accordance with a first embodiment of the invention;

FIG. 7(b) is a cross-sectional view of the device of FIG. 7(a);

FIG. 8(a) is a partial plan view of a MIM device constructed in accordance with a second embodiment of the invention;

FIG. 8(b) is a cross-sectional view of the device of FIG. 7(a);

FIG. 9 illustrates the voltage-current characteristics of the MIM devices illustrated in FIGS. 6 and 7;

FIGS. 14(a) and (b) illustrate in plan view steps in the fabricating process of a MIM element and a picture element electrode in accordance with a sixth embodiment of the invention;

FIG. 15 illustrates in a plan view the electrode pattern at the time of anodizing in accordance with the embodiment illustrated in FIG. 14;

FIG. 16 illustrates the electrode pattern at the time of anodizing in the embodiment illustrated in FIG. 14;

FIG. 17 illustrates the electrode pattern in a twisted nematic liquid crystal panel at the time of anodizing when employing conventional MIM fabrication techniques;

FIG. 20 is a schematic diagram of an equivalent circuit of a MIM device prepared in accordance with the invention;

FIG. 21 illustrates an equivalent circuit for one picture element at the time of connecting the MIM device to the liquid crystal display element;

FIGS. 23(a)-(d) illustrate the steps in the process of manufacturing a MIM device at the time of connecting two MIM elements in parallel with opposite polarity in accordance with a preferred embodiment of the invention;

FIG. 24 illustrates in perspective view the MIM portion at the time of connecting the two MIM elements in parallel in opposite directions in accordance with the embodiment illustrated in FIG. 23;

FIGS. 25(a)-(d) illustrate in plan view the steps in the process for manufacturing MIM elements and the lead portions at the time of connecting two MIM elements in parallel in opposite directions in accordance with another embodiment of the invention;

FIG. 26 is a cross-sectional view of a MIM device and the lead portion at the time of connecting two MIM elements in parallel in opposite directions in accordance with the embodiment of the invention illustrated in FIG. 25;

DESCRIPTION OF THE PREFERRED EMBODIMENTS

Figure 3:
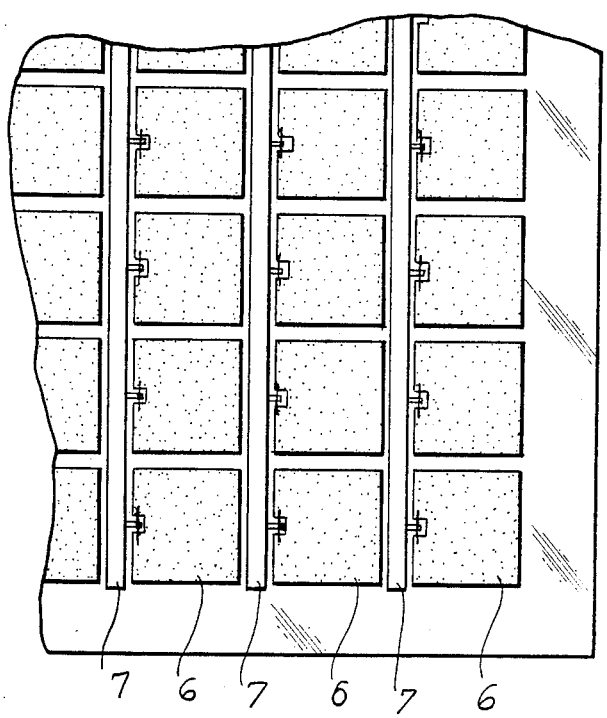
FIG. 3 is a plan view illustrating the position of the MIM elements and the picture element electrodes in a twisted nematic liquid crystal panel.

FIGS. 1 and 2 illustrate the conventional construction of a non-linear resistor using tantalium nitride as shown by Baraff, D. R., et al. In this device, a glass substrate 1 is coated with a $Ta_2O_5$ thin film 2 on which a nitrogen doped Ta thin film 3 is formed by sputtering and patterned into a desired pattern. An oxide film 4 is then formed on the surface of Ta thin film 3 by anodizing. A counter electrode 5 is formed thereon by vacuum evaporation of NiCr/Au thin film which is patterned. A transparent picture electrode 6 is then patterned on substrate 1.

Figure 4:
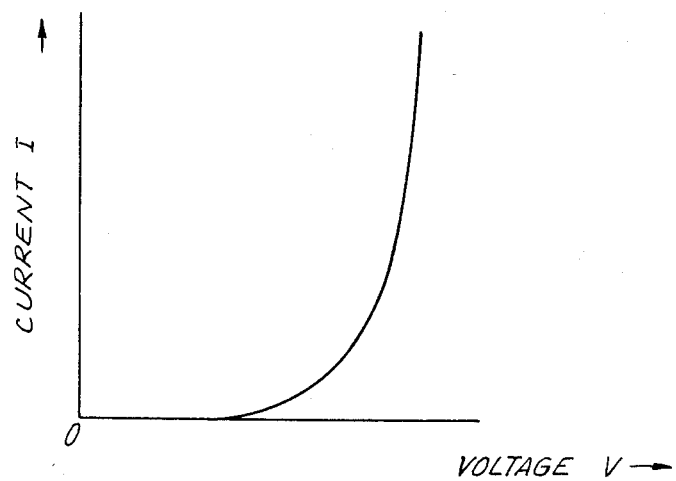
FIG. 4 is a voltage-current characteristic curve of a MIM element.

In order to construct a liquid crystal display device utilizing such a MIM element, substrate 1 is patterned with transparent picture elements 6 and a plurality of column or row transparent electrodes 7 in a matrix as shown in FIG. 3. A twisted nematic liquid crystal panel is formed by encapsulating the liquid crystal material between two such substrates 1. When a voltage is applied between Ta thin film 3 and counter electrode 5 of the MIM, an electric current flows as illustrated in FIG. 4. Herein the relationship between voltage and current depends on the Poole-Frenkel effect represented by the following formula:

$$I = KV \exp(\beta V) \qquad (I)$$

In the above formula (I), I is the electric current, V is the applied voltage and K and $\beta$ are coefficients indicating the ease of flow of the electric current and the non-linearity, respectively.

Figure 5:
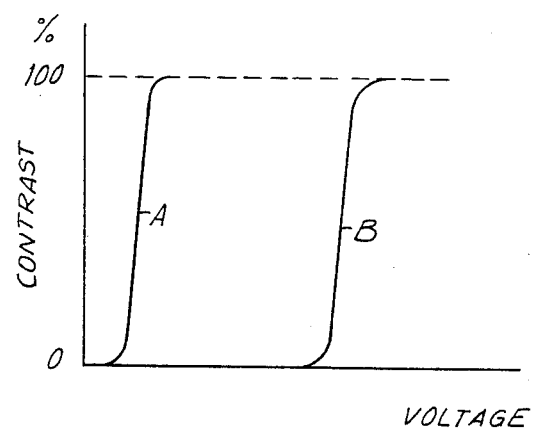
FIG. 5 illustrates the differences in the voltage-contrast characteristics of a liquid crystal display element when utilizing a MIM element and without utilizing a MIM element.

When the MIM element is utilized in a liquid crystal display panel driven in a multiplex-driving mode, the voltage-contrast curve A as shown in FIG. 5, of the liquid crystal display panel shifts to the high voltage side B and becomes more vertical. In view of this shift, it has been reported that it is possible to utilize the multiplex drive in a 1/100 to 1/200 duty ratio. This is a significant advantage; however, the voltage current characteristics of such a MIM element depends upon the polarity of the applied voltage. In other words, as shown in FIG. 6, more current flows when applying a positive voltage to the Ta side than when applying a negative voltage to the Ta side. When driving a twisted nematic type liquid crystal display element coupled with a MIM element by applying symmetrical alternative waveforms which are used in driving a conventional twisted nematic liquid crystal display device, the effective voltage applied to the liquid crystal tends to be asymmetric about the zero level. This includes a direct current component due to the asymmetric shape of the waveform. This direct current component results in deterioation of the liquid crystal and a shortening of the liquid crystal life.

According to this design of Baraff, D. R., et al., the liquid crystal picture element has a 1.25 mm pitch and size of the MIM elements are 12 μm×12 μm. A dot matrix liquid crystal display panel generally utilizes a size between 0.3 and 0.5 mm pitch. Accordingly, a MIM for such a device should have a dimension from 3 to 5 μm square, proportionately.

EXAMPLE 1

Referring now to FIGS. 7(a) and 7(b), a plan view and cross-sectional view, respectively of a MIM element constructed and arranged in accordance with a first embodiment of the invention is shown. A glass substrate 13 is covered with a $Ta_2O_5$ thin film 8. A nitrogen doped Ta thin film 9 is formed in a 2000 Å thickness by RF sputtering under an argon and nitrogen pressure of $10^{-2}$ Torr with a nitrogen flow rate of 1%. Nitrogen doped Ta thin film 9 is etched to a desired shape and an oxide layer 10 is formed thereon by anodizing at a voltage of 30 volts in 0.01% citric acid solution. A Ni-Cr/Au thin film is vacuum evaporated across substrate 13 and a lead portion 11 and a counter electrode 11' are formed by etching the Ni-Cr/Au layer to the desired shape. A transparent liquid crystal driving element electrode 12 of Ni-Cr/Au thin film is then formed. The surface area of each MIM device is equal to 1 mm$^2$.

EXAMPLE 2

A MIM element as shown in FIG. 8(a) in plan view and FIG. 8(b) in a cross-section was formed in the same manner as Example 1. In this device counter electrode 11' fully overlaps Ta metal film 9 in the form of a elongated strip which facilitates uniformity of surface area of the MIM devices.

When evaluating the voltage-current characteristics of the MIM elements formed in Examples 1 and 2, the symmetrical characteristic as shown in FIG. 9 is obtained. However, when a photolithography mask is not properly aligned for etching, lead portion also forms the counter electrode in the MIM element as in Example 1, the areas of the two MIM elements are not equal and the symmetrical voltage-current characteristics as shown in FIG. 9 may not be obtained. In the construction illustrated in Example 2, the symmetrical voltage-current characteristics are obtained even if there is slight deviation in mask alignment.

When forming MIM element using Ta thin film without nitrogen doping and anodizing for forming the oxide film, symmetrical voltage-current characteristics are also obtained regardless of polarity. As explained above, in accordance with these embodiments of the invention, it is possible to connect MIM's having reverse polarity with each other in series through a comparatively simple fabrication process. This permits applying symmetrical alternating waveforms to a twisted nematic type liquid crystal display device for avoiding applying the direct current component of the asymmetrical driving waveforms. This results in prolonging the life of the liquid crystal display element.

EXAMPLE 3

FIGS. 10 and 11 illustrate the steps of fabricating a MIM element and a picture element electrode in accordance with a further embodiment of the invention. FIGS. 10 and 11 are respectively a top plan view and a cross-sectional view.

Figure 10A:
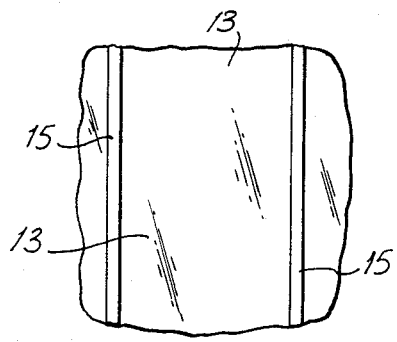
FIGS. 10(a)-(d) illustrates in plan view steps in a fabricating process of a MIM element and a picture element electrode in accordance with a third embodiment of the invention.
Figure 11A:
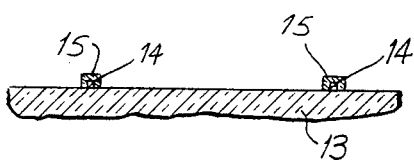
FIGS. 11(a), (b) and (c) illustrate in cross-section steps in the fabricating process of FIG. 10.

The MIM element is fabricated by first depositing the Ta thin film or a nitrogen doped Ta thin film by sputtering on a transparent substrate 13, such as Pyrex or soda lime glass covered with a thin film of $Ta_2O_5$, $SiO_2$ film or the like. Subsequently, a Ta thin film or nitrogen doped Ta thin film is patterned in the desired pattern for forming a lead electrode 14 which is then anodized. Substrate 13 with lead electrode 14 is placed into a 0.01% citric acid solution and a $Ta_2O_5$ thin film 15 is formed in the anodizing process as shown in FIGS. 10(a) and 11(a). Subsequently, a metallic thin film, such as Ta, Ni, Cr, Ni-Cr alloy, Al, Ti or Cu is formed on the surface of substrate 13 by the usual manufacting processes for forming thin films, such as the sputtering process or vacuum evaporation. Lead electrodes 16 and 16' are formed by patterning the metallic thin film as shown in FIGS. 10(b) and 11(b).

Figure 10B:
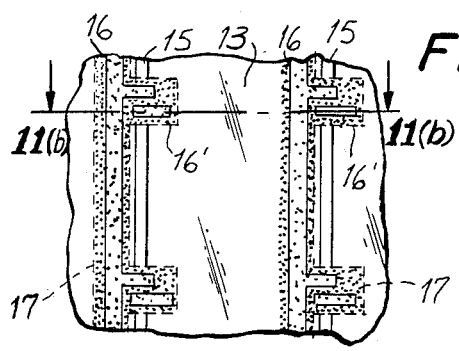
Figure 11B:
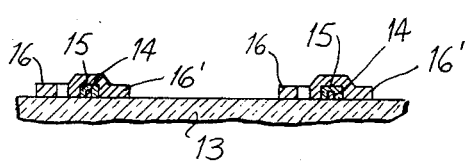
Figure 10C:
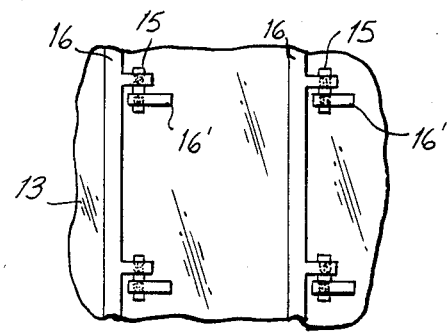
Figure 10D:
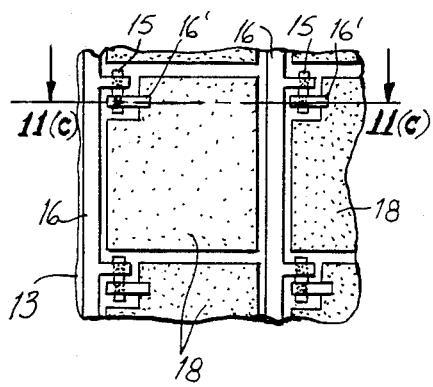
Figure 11C:
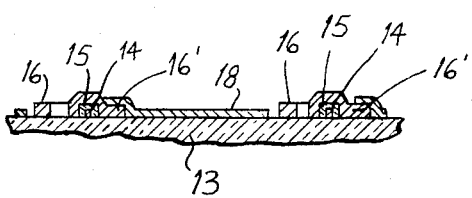

The unnecessary portions of the anodized layer are etched to form the pattern as shown in FIG. 10(c) while covering portion 17 shown by a dotted line in FIG. 10(b) with a resist. As shown in FIGS. 10(d) and 11(c), a picture element electrode 18 is formed from a transparent electrode material, such as $In_2O_3$, $SnO_2$, ITO ($In_2O_3 + SnO_2$), or an extremely thin film of Ni, Cr/Au or Cr/Au for completing substrate 13 for use in a matrix display panel.

EXAMPLE 4

In this embodiment of the invention illustrated in FIG. 12, a Ta thin film or nitrogen doped Ta thin film is formed on a transparent substrate 20 by the sputtering process. Subsequently, Ta thin film or nitrogen doped Ta thin film is patterned into the shape as shown in FIG. 12(a) for forming a lead electrode 21 which will be anodized. An oxide film 22 is then formed thereon by anodizing as described in Example 3.

Figure 12A:
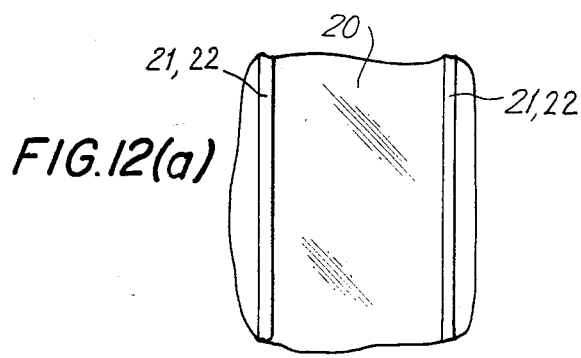
FIGS. 12(a)-(d) illustrate in plan view steps in the fabricating process of a MIM element and a picture element electrode in accordance with a fourth embodiment of the invention.
Figure 12B:
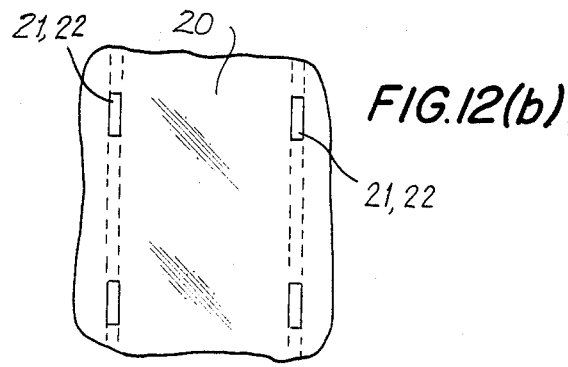
Figure 12C:
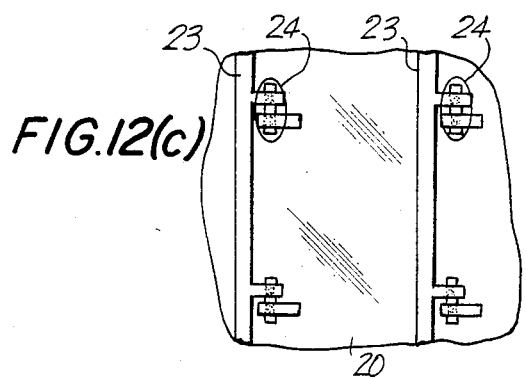
Figure 12D:
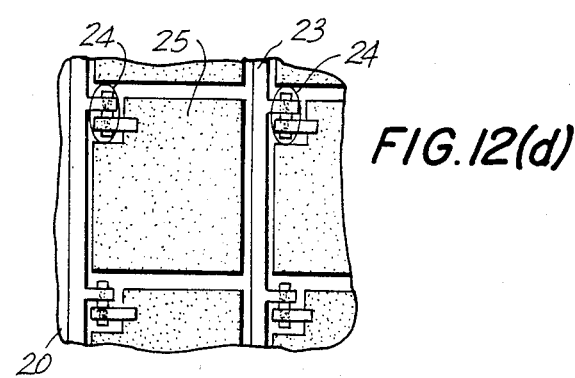

Following anodizing, the unnecessary portions of lead electrode 21 which have been anodized and oxide layer 22 are etched to form the pattern illustrated in FIG. 12(d). A metallic thin film as used in Example 3 is then formed thereon. Further, a lead electrode 23 and MIM element 24 are formed by patterning as shown in FIG. 12(c). Finally, picture element electrode 25 is formed from a transparent electrode material as shown in FIG. 12(d).

EXAMPLE 5

A Ta lead electrode which will be anodized and an anodized film thereon are formed on a substrate and the unnecessary portions are etched in accordance with the process described in Example 4. Subsequently, a picture element electrode is patterned with a transparent conductive film, such as, ITO $Ni_2O_3$ and $SnO_2$. A lead electrode and a MIM element are then formed with a metallic thin film as in Example 3. In the case where this process is utilized, the metallic interconnecting portion connecting the MIM element and the picture element electrode has a good step coverage.

EXAMPLE 6

Figure 13A:
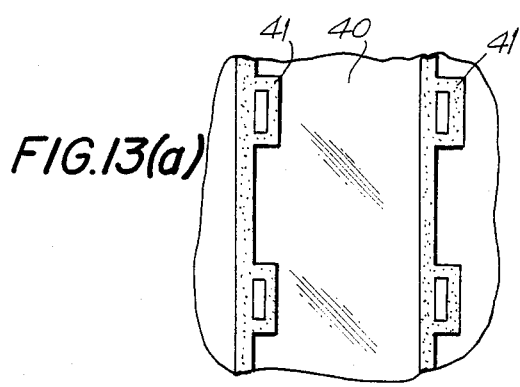
FIGS. 13(a), (b) and (c) illustrate in plan view steps in the process of fabricating a MIM element and a picture element electrode in accordance with a fifth embodiment of the invention.
Figure 13B:
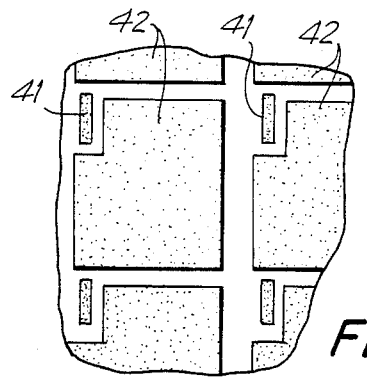

A first metallic thin film is patterned as described in Examples 3-4 and an anodized film 41 is formed thereon as shown in FIG. 13(a). A transparent conductive thin film is formed by sputtering or vacuum evaportaion. Then, the transparent conductive film, the anodized thin film and the first metallic thin film are etched in order to form the pattern as illustrated in FIG. 13(b).

Figure 13C:
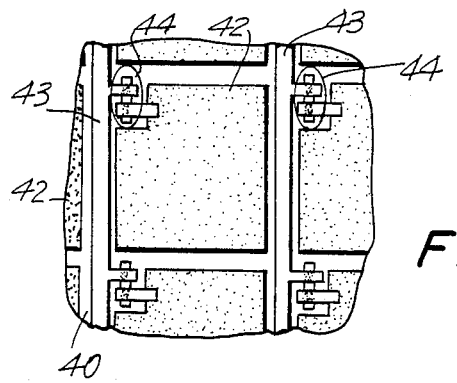
Figure 18:
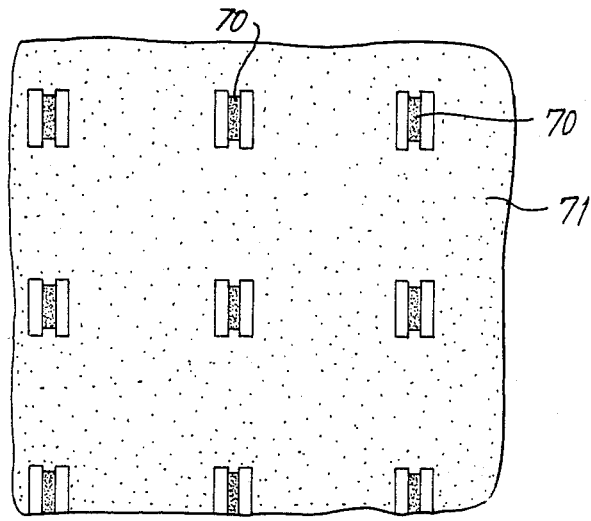
FIG. 18 illustrates the electrode pattern at the time of anodizing the first metallic thin film in accordance with a further embodiment of the invention.

As shown in FIG. 13(c), a lead electrode 33 and a MIM element 44 are formed with one of the metals used in Example 3. In accordance with this process where Ta thin film is used as the first metallic thin film, a MIM element having a construction of Ta-$In_2O_3$-$Ta_2O_5$-Ta-$Ta_2O_5$-$In_2O_3$-Ta-$In_2O_3$ (the picture element electrode) is obtained. This process avoids one of the photolithographic processing steps required in Examples 3–5, thus resulting in lowering the cost of manufacture.

EXAMPLE 7

Referring to FIG. 14, an $In_2O_3$ and a Ta thin film are sequentially formed on a transparent substrate 50. A resist is deposited in the pattern of a lead electrode 51 for anodization and a picture element electrode 52 is deposited and, Ta thin film is removed by plasma etching with $CF_4$ gas. Then, the $In_2O_3$ thin film is etched in a warm 10% hydrochloric acid solution to provide the pattern as shown in FIG. 14(a). After the resist is removed, Ta thin film is anodized in a 0.01 weight percent citric acid solution. At this time, the Ta thin film layer on picture element electrode 52 is not anodized as this portion is not conductive.

With resist remaining in the pattern of the shaded portion 53 as shown in FIG. 14(b), plasma etching with $CF_4$ gas is performed. At this time, the thickness of the $Ta_2O_5$ thin film on lead electrode 51 to be anodized is so thin as to be only several 100 A. However, the etching rate of $Ta_2O_5$ thin film is lower than that of Ta thin film, or about 1 to 3. Accordingly, when lead electrode 51 for anodization is to be removed by etching, Ta thin film on picture element electrode 52 is etched away while lead electrode 51 will remain insulating electrode 51 so that the $In_2O_3$ thin film will be exposed in the plasma. However, $In_2O_3$ is not etched since the etching rate is also low in the plasma with $CF_4$ gas. After the resist is removed, the Ta thin film is formed by the sputtering process and similarly patterned as described in Example 6 to form first metal thin film 53 of the MIM device. The lead electrodes and the MIM element are then formed. This method is also advantageous as it eliminates one of the photolithographic processing steps required in the processes described in Examples 3–5.

EXAMPLE 8

Referring to FIGS. 15 and 16, a Ta thin film 62 is formed on a transparent substrate 60 by the sputtering process. Then, a lead electrode 61 for anodization is patterned in the form of a mesh or a grid. An electrode 63 for connecting with the current source at the time of anodizing is patterned with a pattern as shown in FIG. 16 so it may be readily connected with the current source. In the conventional systems, a lead electrode 64 for anodizing and the electrode for connecting with the current source 65, as shown in FIG. 17, are independent from each other for each line. Therefore, any defect in the jig for connecting to the current source causes a contact failure of a portion of a line, with the result that anodization does not occur. Alternatively, anodization does not occur due to the disconnection of lead electrode 64 for anodization.

In contrast, and in accordance with this embodiment of the invention, a simple and sure jig for contacting with the current source can be utilized. For example, a clip may be used as a jig. Even if a portion of lead electrode 61 for anodization is disconnected, the portion wherein the MIM element is formed (62 in FIG. 15) is anodized provided that the MIM formed portion 62 is not defective. Such defects in the MIM region as a practical matter do not occur so that failure of anodization rarely occurs in accordance with this embodiment.

EXAMPLE 9

This example follows the procedure described in connection with Example 8. As shown in FIG. 15, a Ta thin film 71 is deposited on the entire surface of a substrate except in the region where a plurality of MIM elements 70 are to be formed. According to this method, the defect rate of anodization decreases as such as any failures are due to the MIM element formed portion 70, which as a practical matter does not occur.

EXAMPLE 10

Figure 19:
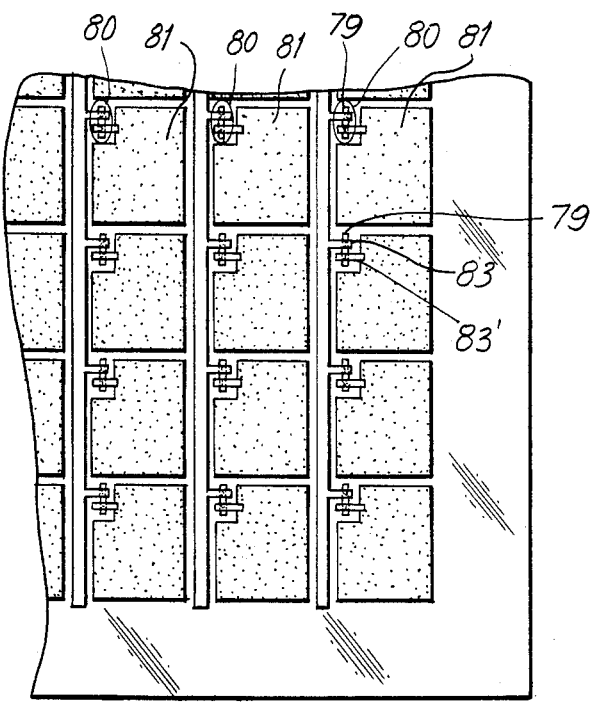
FIG. 19 illustrates the position of MIM elements and the picture element electrodes in a matrix in accordance with yet another embodiment of the invention.
Figure 22:
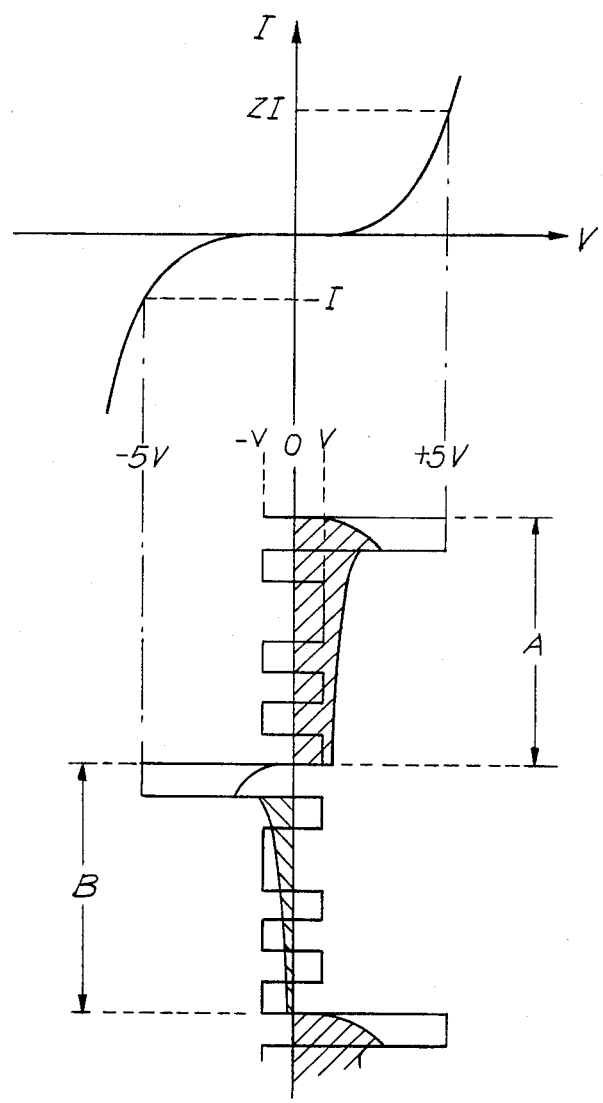
FIG. 22 illustrates the waveform at the time of connecting a MIM device to the liquid crystal display element and the driving waveform in the generalized AC amplitude selective multiplexing driving method.

Referring to FIG. 19, a plurality of MIM elements 80 and picture elements electrode 81 are fabricated in accordance with the above described process and are arranged in a grid on a transparent substrate 82. A complimentary substrate provided with stripe-like transparent electrodes is positioned so that each MIM element 80 and its corresponding picture element 81 constitute a matrix with the stripe-like transparent electrodes of the complimentary substrate. Thus, a cell is formed of transparent substrate 82 and the corresponding substrate and a liquid crystal material encapsulated therebetween. The resulting product is an active matrix TN-type liquid crystal panel.

The MIM element is formed in a region where upper electrodes 83 and 83' are piled on lower electrode 82. The equivalent circuit of the MIM element can be considered to represent that as shown in FIG. 21(a). The two circuits include capacitances 84 and 84', respectively, connected to non-linear resistances 85 and 85' in parallel therewith and the two circuits are connected in series. However, the equivalent circuit of a MIM element may be functionally considered to be that as shown in FIG. 21(b). In this circuit a capacitance 86 and a bi-directional non-linear resistance 87 are connected in parallel.

The characteristics of the above-described MIM elements are determined from its capacitance and resistance. That is, the characteristic of the MIM element is determined by controlling the thickness of the anodized oxide, the quantity of the oxide and the area of the device. Therefore, as lower electrode 82, upper electrodes 83 and 83' and picture element electrode 81 can be formed in various patterns and orders, they should be designed so as to produce a good display effect in a TN liquid crystal panel.

In the case where the MIM element is patterned, the photolithographic technique of fine patterning in a level of about several um to 10 um is required. Moreover, the surface flatness of the transparent substrate is also significant. Both glass and soda lime is advantageous at present from the point of view of the substrate flatness and the cost of the substrate. In this case, a transparent thin film layer of $SiO_2$, $Si_3N_4$, $Ta_2O_5$ and $TiO_2$ must be deposited on the substrate as a passivation layer in view of the soda content. By forming the transparent thin film layer on MIM elements 80 and picture element electrodes 81, the transparent thin film layer functions effectively not only as a passivation layer, but also as a layer to eliminate the direct current in driving the matrix TN-type liquid crystal panel and as a protection layer for preventing mechanical damage to the MIM element when rubbing the substrate for liquid crystal orientation.

Two methods can be employed for reliably orientating the liquid crystal material. That is, the oblique evaporation process for aligning an inorganic material, such as SiO. Alternatively, an orientation layer formed of an inorganic compound, such as a polyamide, an organic silane, or a fluorine resin may be formed on the substrate and rubbed in one direction. Any type of liquid crystal material, provided that it may be used in a TN panel can be utilized in a TN liquid crystal panel including MIM elements. Such examples of liquid crystals which may be utilized in these panels are liquid crystals whose principal component is an azoxy, an ester, a biphenyl, a phenyl-cyclohexane, pyrimidine, dioxane, cyclohexane-carbocyclic acid esters, or the like.

The larger the capacatance of the liquid crystal is, the greater the dynamic margin obtainable. Additionally, the liquid crystal materials in which the dielectric anisotropy, that is the difference between the dielectric constant and the direction parallel to the crystal axis and the dielectric constant in the direction perpendicular thereto, is positive and larger can be operated at a lower voltage. Therefore, it is favorable to utilize a liquid crystal having increased permativity and higher dielectric anisotropy for use in a panel including MIM elements. Alternatively, it is possible to use a liquid crystal having a greater capacatance and operated at a lower voltage by making the gap between substrates in the cell thinner.

EXAMPLE 11

A Ta thin film of 2000 Å is formed on a Pyrex glass substrate by sputtering in accordance with the process disclosed in Example 4. After patterning the Ta thin film, the film is anodized at a voltage of 20 volts utilizing platinum as the cathode in a 0.01 weight percent citric acid solution. After eliminating the unnecessary portions of the aodized film and the Ta thin film, a Ta thin film of 2000 Å thickness is formed by sputtering which is then patterned for forming a MIM element. Two MIM elements having the dimensions of 10 μm square are connected to a picture element electrode having a dimension of 0.39×0.35 mm by patterning of a ITO film of 600 Å thickness. A TN panel having an 8 μm gap is formed after depositing a polyimide resin film and rubbing for orientating the liquid crystal. A liquid crystal material in which $V_{th}$ is 1.5 $V_{rms}$ and $V_{sat}$ of 2.05 $V_{rms}$ is encapsulated in the TN panel.

The contrast image when a picture element is turned on is over 90% and a picture element in the OFF condition is under 10% in the range of 13.8 to 16.5 volts of the ON waveform. These results are obtained when this TN panel is operated by the voltage averaging means of which the duty is 1/200 and the bias level is V-5V. The ON-OFF voltage in the range of 7.5 to 10 V has a contrast difference of less than 10% when a conventional TN liquid crystal panel without a MIM element is operated by the same driving waveform.

The present invention is not limited to the above described examples. For example, it is possible to utilize various types of materials, such as Al, Nb, Ti, Si or these materials doped with nitrogen or carbon as the metal electrode of the MIM element. Construction of the MIM element in accordance with the invention as described herein offsets the rectifing characteristics due to nonuniformity to metal oxide layer interfaces by using one MIM element for a single picture element.

Further, the invention makes it possible to fabricate MIM devices under less taxing accurate conditions compared with devices including one MIM element per picture element. Further, the invention also minimizes the effects in MIM devices due to the failure of forming the anodized oxide film. Accordingly, it is possible to provide a TN liquid crystal panel wherein the failure of a picture element is extremely remote.

the following Examples illustrate the embodiments of the invention wherein two MIM elements connected to each other in parallel are connected in series to a picture element electrode.

EXAMPLE 12

A transparent conductive layer of ITO ($In_2O_3$+$SnO_2$) is formed on a Pyrex substrate 140 and is photoetched to form a picture element electrode 141 as illustrated in FIG. 23(a). A Ta thin film is formed by sputtering onto picture element 141 to provide the shaded pattern as illustrated in FIG. 23(b). An oxide layer is then formed on the surface by anodizing the Ta thin film in a 0.01 weight percent citric acid solution.

MIM element forming portions 142a and 142b and a lead portion 143 are formed on surface 140 by photo-etching of the anodized film and the non-used portion of the Ta thin film. This is followed by a treatment at 250° C. in air for about 1 hour. MIM elements 144a and 144b and lead portion 143′ are formed by depositing a Cr-Au thin film by evaporating and photo-etching. The positioning of MIM elements 144a and 144b, picture element electrode 141 and lead portions 143 and 143′ are shown in the perspective view of the MIM element region in FIG. 24.

A cooperating opposed substrate having striped transparent electrodes for cooperating with picture element electrode 41 is formed. A polyamide coating is baked onto substrate 140 and the cooperating substrate and rubbed with a cotton cloth for orienting a liquid crystal material. When the substrates are positioned for forming a panel, the liquid crystal molecules placed between these substrates are twisted at an angle of about 90 degrees with the substrates bonded to maintain a gap of between about 5–20 μm with the liquid crystal encapsulated therebetween. The liquid crystal display panel was completed by placing polarizers onto the outer surfaces of both substrates in a manner such that the axis of polarization coincide with the axis of orientation of the liquid crystal molecules.

EXAMPLE 13

Referring to FIG. 25 and following the procedures utilized in Example 12, picture element electrode 161 is formed on transparent substrate 160. After a Ta thin film is deposited by sputtering, it is patterned for forming the pattern as shown in FIG. 25(a) and is then anodized. Lead portions 163 are formed by photo-etching of the non-used portions of Ta thin film after protecting the MIM formed portions 162a and 162b with a photo resist as shown in FIGS. 25(b) and 25(c). First thin film layer of Ta is then exposed on the side edge in the region 164 (shown with a thick solid line in FIG. 25(c)). Additionally, at this time it is desirable to etch the oxide film and Ta thin film in such a way so as to make a taper in the etching pattern on the side edge.

Following exposure of edge 164, a Cr-Au thin film of a second metal layer is deposited on substrate 160 by evaporation. Lead portion 165 and MIM elements 166a and 166b are formed by photoetching of the Cr-Au thin film of the second metal layer in such a manner that the Ta film exposed portion 164 on the edge of lead portion 163 of first layer of Ta thin film as shown in 25(d) is covered with Cr-Au thin film. FIG. 26 illustrates in the sectional view, the portion drawn along line 26—26 in FIG. 25(d). This cross-section illustrates the tapering at exposed side edge 164 along first Ta thin film 163.

By forming tapered edge sections 164 it is possible to contact electrically lead portion of first metal layer 163 with lead portion 165 of the second metal layer. This overcomes any difference of wiring resistance between lead portions 163 and 165 to MIM elements 166a and 166b, respectively, which may result from differences in material and thickness of each layer. This also permits reduction in the rectification of the voltage-current characteristics when two MIM elements are connected in parallel in the opposite direction.

As noted above, these two examples are set forth as being illustrative of the invention and are not intended in a limiting manner. For example, with respect to the substrate, not only may Pyrex be used, but a soda-lime glass is also advantageous in view of its flatness and low cost. When utilizing a soda-lime glass, the passivation layer is utilized in order to prevent the alkali component of the glass from melting. Further, various types of metals, such as Al, Nb, Ti, Mo and Hf may be utilized in place of Ta or any of these metals doped with nitrogen, carbon and hydrogen can be utilized as the first metal layer and the anodized oxide layer of these metals can be the insulating layer. Additionally, any conductive material can be utilized as the counter electrode of the MIM element. For example, the same materials as the first metal layer may be utilized or Ni, Cr, Cu, Au or alloys of those metals can be utilized as the opposed counter electrode.

The liquid crystal display method described in connection with the invention has been described utilizing a twisted nematic liquid crystal material. However, other types of liquid crystal, such as a guest-host wherein a dichroic dye (guest) is included in the liquid crystal (host), where the DSM-method utilizing the dynamic scattering effect of the liquid crystal molecules, may also be utilized. With respect to the method of orientation of the liquid crystal material, the ordinary methods utilized in conventional display panels may also be utilized.

Figure 27:
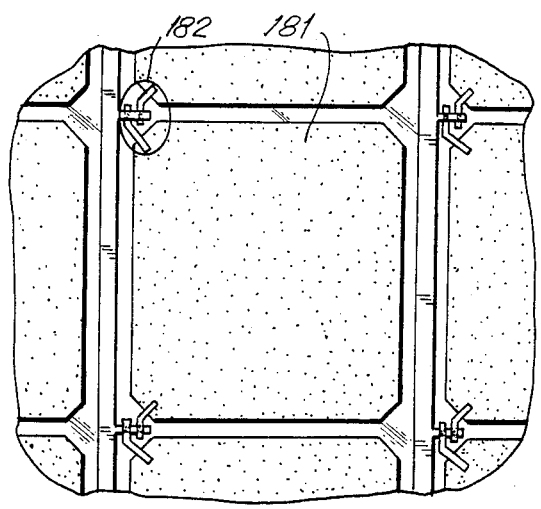
FIG. 27 is a plan view of a display element electrode in accordance with another embodiment of the invention.
Figure 28:
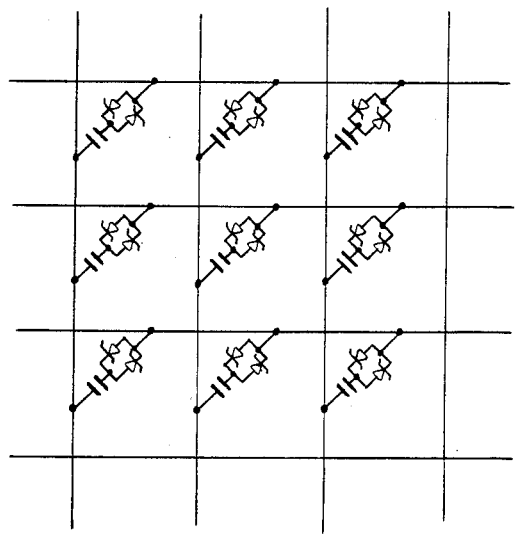
FIG. 28 illustrates the equivalent circuit when connecting two MIM elements in parallel in opposite directions to the liquid crystal display elements in accordance with the invention.

The electrical characteristics of the panel are not effected by providing a pattern of MIM elements and picture element electrodes in accordance with the invention. For example, as shown in FIG. 27, it is possible to prevent a distorted pattern of picture element electrodes of the type shown in Examples 12 and 13, by utilizing a picture element electrode 181 in the shape of a polygon and by providing MIM elements 182 in the gap between adjacent picture element electrodes 181. By utilizing this structure, a liquid crystal display panel can be provided wherein two MIM elements are connected in parallel in the opposite direction. In this case, equivalent circuits of the liquid crystal display device is as illustrated in FIG. 28.

Figure 29:
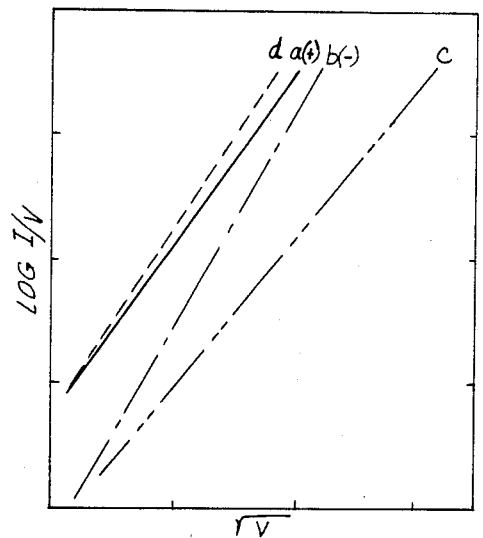
FIG. 29 illustrates the voltage-current characteristics when connecting one MIM element to a display element, two MIM elements in opposite directions in series and two MIM elements in opposite directions in parallel in accordance with the invention.

Examples 12 and 13 describe connecting two MIM elements in parallel with a picture element electrode. The earlier examples describe connecting two MIM elements in series. Rectification of the voltage-current characteristics is reduced by connecting two MIM elements in the opposite direction in series. However, the voltage-current characteristics of these devices is as shown as curve C in FIG. 29. The comparison figures show the voltage-current characteristics in curves A and B in the case of one MIM element. The voltage-current characteristics of coupling two MIM elements in parallel in accordance with this embodiment of the invention is as shown as curve D. The slope of this curve indicates that in the Poole-Frenkel constant in the expression of formula (I) (corresponding to $\beta$) is larger when two MIM elements are connected in parallel than when the two MIM elements are connected in series. When the MIM element is coupled with the liquid crystal display picture element, it is utilized as a switching device by relying on the non-linearity of the voltage-current characteristic of the MIM element. In this case, it is desirable that $\beta$ be large for high multiplex driving, and it has been demonstrated that a large $\beta$ can be obtained by utilizing two MIM elements in parallel. Accordingly, by constructing and arranging a liquid crystal display panel in accordance with the invention, a liquid crystal device having a long useful life can be readily obtained compared with those devices utilizing one MIM element coupled to a liquid crystal picture element.

It will thus be seen that the objects set forth above, among those made apparent from the preceding description, are efficiently attained and, since certain changes may be made in carrying out the above process, in the described product, and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A matrix liquid crystal display device including a metal-insulator-metal (MIM) construction, comprising:
   a first substrate,
   a plurality of liquid crystal display picture element electrodes disposed on the first substrate and spaced apart in a matrix array of columns and rows;
   a plurality of leads formed on the first substrate between one of the associated columns or rows of picture element electrodes;
   a non-linear device coupled in series between each picture element electrode and the associated lead, the non-linear device including two MIM switches connected in parallel with each other, wherein one of the MIM switches comprises a lower metal thin film on the surface of the substrate coupled to said lead, an insulator thin film on said lower metal thin film and an upper metal thin film disposed on the insulator thin film and including a lead portion coupled to the associated picture element electrode; and the other MIM switch comprises a lower metal thin film including a MIM portion and a lead portion on said substrate, said lead portion coupled to the associated picture element electrode and said MIM portion in the region between said lead and said picture element electrode, an insulator film on said lower metal thin film and an upper metal thin film disposed on the MIM portion of said insulator and the lower metal thin film and coupled to said lead.

2. The device of claim 1, wherein said lead comprises a first lead layer of a substantially elongated metal thin film on the substrate having an upper surface and two edge surfaces, an insulator film on the upper surface of the first lead layer and an upper metal lead layer on the insulator layer and extending over and contacting with an edge of the lower metal lead layer for electrically coupling said two lead layers, said first lead layer coupled to the lower metal thin film of one of the MIM switches and the second lead layer coupled to the lead portion of the upper metal thin film of the other MIM switch.

3. The device of claim 1, wherein the metal thin films are metals selected from the group consisting of Ta, Ni, Cr, Ni-Cr alloy, Al, Ti, Cu or one of said metals doped with nitrogen or carbon.

4. The device of claim 3, wherein the insulator thin film is an anodized oxide of the metal or doped metal.

5. The device of claim 1, wherein the metal thin films are selected from the group consisting of Ta or nitrogen doped Ta and the insulator film is an anodized oxide of said Ta or nitrogen doped Ta.

6. The device of claim 1, wherein the metal thin film is Ta and the insulator is $Ta_2O_5$.

7. The device of claim 1, wherein the lower metal thin film of each MIM element is formed from the same metal thin film deposited on the substrate.

8. The device of claim 1, wherein the upper metal thin film of each film element is formed from the same second metal thin film deposited on the substrate.

9. The device of claim 1, wherein the lower metal film of each MIM element is formed from the same first metal thin film deposited on the substrate and the upper metal thin film of each MIM element is formed from the same second metal thin film deposited on the substrate.

* * * * *